United States Patent
Papen et al.

(10) Patent No.: US 10,694,642 B2
(45) Date of Patent: Jun. 23, 2020

(54) COMPUTING DEVICE COOLING FACILITY INCLUDING A MIXING CHAMBER

(71) Applicant: Core Scientific, Inc, Bellevue, WA (US)

(72) Inventors: Jeffrey Papen, Wilsonville, OR (US); Matthew Renner, San Francisco, CA (US); Montgomery Sykora, Denver, CO (US); Weston Adams, Logandale, NV (US)

(73) Assignee: Core Scientific, Inc., Bellevue, WA (US)

(*) Notice: Subject to any disclaimer, the term of this patent is extended or adjusted under 35 U.S.C. 154(b) by 0 days.

(21) Appl. No.: 16/268,433

(22) Filed: Feb. 5, 2019

(65) Prior Publication Data

US 2020/0045856 A1 Feb. 6, 2020

Related U.S. Application Data

(63) Continuation of application No. 16/053,648, filed on Aug. 2, 2018, now Pat. No. 10,299,412.

(51) Int. Cl.
*H05K 7/20* (2006.01)
*H05K 7/14* (2006.01)

(52) U.S. Cl.
CPC ....... *H05K 7/20745* (2013.01); *H05K 7/1497* (2013.01); *H05K 7/20727* (2013.01)

(58) Field of Classification Search
CPC ............................ H05K 7/20745; F24F 13/06
USPC .................................................. 361/679.46
See application file for complete search history.

(56) References Cited

U.S. PATENT DOCUMENTS

| | | | |
|---|---|---|---|
| 3,363,534 A * | 1/1968 | Spradling | F24F 13/04 454/267 |
| 3,614,922 A | 10/1971 | Sobin | |
| 4,872,504 A | 10/1989 | Huebner | |
| 8,223,495 B1 | 7/2012 | Carlson et al. | |
| 8,659,895 B1 | 2/2014 | Carlson et al. | |

(Continued)

FOREIGN PATENT DOCUMENTS

WO 02104090 A1 12/2002
WO 2013039645 3/2013

OTHER PUBLICATIONS

PCT Partial International Search Report dated Nov. 11, 2019 for copending International Application No. PCT/US2019/044673.

(Continued)

*Primary Examiner* — Mukundbhai G Patel
(74) *Attorney, Agent, or Firm* — Fishman Stewart PLLC

(57) ABSTRACT

A system for cooling computing devices within a facility includes an air inlet that delivers cool air to a supply air space within the facility, an exhaust air damper that is configured to exhaust heated air from an exhaust air space within the facility, and computing devices that are arranged within the facility to at least partially partition the supply air space from the exhaust air space. The system also includes an air filter that is configured to filter the cool air and a mixing damper that is positioned within the interior space of the facility and that is operable to control an amount of exhaust air that is mixed with the cool air. The cool air and/or a portion of the exhaust air are used to cool the computing devices and airflow through the system is substantially driven by fans of the computing devices.

18 Claims, 7 Drawing Sheets

(56) References Cited

U.S. PATENT DOCUMENTS

| | | | |
|---|---|---|---|
| 8,857,204 B2 | 10/2014 | Reytblat | |
| 8,943,757 B2* | 2/2015 | Parizeau | E04H 1/005 |
| | | | 52/79.1 |
| 9,313,929 B1 | 4/2016 | Malone et al. | |
| 9,476,657 B1 | 10/2016 | Pettis et al. | |
| 9,554,491 B1 | 1/2017 | Wong et al. | |
| 9,629,285 B1 | 4/2017 | Lachapelle et al. | |
| 9,674,988 B2 | 6/2017 | Dernis et al. | |
| 9,677,777 B2 | 6/2017 | Karamanos et al. | |
| 2008/0055848 A1 | 3/2008 | Hamburgen et al. | |
| 2009/0310300 A1 | 12/2009 | Chrysler | |
| 2010/0188810 A1 | 7/2010 | Andersen et al. | |
| 2011/0138708 A1 | 6/2011 | Chazelle et al. | |
| 2012/0024502 A1 | 2/2012 | Khalifa et al. | |
| 2012/0142265 A1 | 6/2012 | Wei | |
| 2012/0197828 A1 | 8/2012 | Yi | |
| 2012/0258654 A1 | 10/2012 | Peng et al. | |
| 2013/0062047 A1 | 3/2013 | Vaney et al. | |
| 2013/0244563 A1* | 9/2013 | Noteboom | F24F 11/0001 |
| | | | 454/250 |
| 2014/0069127 A1* | 3/2014 | Bailey | H05K 7/20745 |
| | | | 62/96 |
| 2014/0133092 A1 | 5/2014 | Leckelt et al. | |
| 2015/0241888 A1 | 8/2015 | Kodama | |
| 2015/0327408 A1 | 11/2015 | Ruiz et al. | |
| 2016/0249484 A1 | 8/2016 | Parizeau et al. | |
| 2017/0042067 A1 | 2/2017 | Parizeau et al. | |
| 2017/0176029 A1 | 6/2017 | Wilding et al. | |
| 2017/0196125 A1 | 7/2017 | Crosby, Jr. et al. | |
| 2017/0269648 A1 | 9/2017 | Ruiz et al. | |
| 2018/0077822 A1 | 3/2018 | Sloan et al. | |

OTHER PUBLICATIONS

International Search Report dated Jan. 23, 2020 for copending International Application No. PCT/US2019/044673.

Cindy Kiddy: "psd1212ptb1 SUNON", Taiwan (R.O.C), Dec. 31, 2010 (Dec. 31, 2010), pp. 1-14, XP055657800, Retrieved from the Internet: URL:https://nl.mouser.com/datasheet/2/659/ Sunon-08142017-PSD1212PTB1-A.(2).Z.GN%20(D12018800G-1216991.pdf [retrieved on Jan. 14, 2020].

\* cited by examiner

COMPUTING DEVICE COOLING FACILITY INCLUDING A MIXING CHAMBER

CROSS-REFERENCE TO RELATED APPLICATION

This application is a continuation of U.S. patent application Ser. No. 16/053,648, filed on Aug. 2, 2018, entitled "SYSTEM AND METHOD FOR COOLING COMPUTING DEVICES WITHIN A FACILITY," the content of which is incorporated by reference herein in its entirety.

BACKGROUND

Relatively large facilities are commonly used to house computing devices, which may function as data or processing centers. The increasing use of online computing and cloud computing services has greatly increased the demand for such facilities. The use of computing devices in the blockchain art has likewise increased the demand for computing device facilities. The substantial amount of computing devices within a facility often results in substantial heat generation within the facility due to the appreciable power requirements of the computing devices, which can be in excess of 30 kilowatts per linear foot of computing space. Various means have been used to cool such facilities including the use of conventional HVAC systems, liquid cooled systems and the like.

BRIEF SUMMARY

The embodiments described herein relate to a system and method for cooling computing devices within a facility. According to one aspect, a system for cooling computing devices within a facility is described. The facility has an interior space that includes a supply air space and an exhaust air space. The supply air space is configured to supply cool air to the computing devices to cool the computing devices during operation of the computing devices. The exhaust air space is configured to exhaust or vent heated air generated from the computing devices inside the facility to the external environment. The system includes an air inlet that is coupled with an exterior wall of the facility and that is configured to deliver cool air to the supply air space from the external environment. The system also includes an exhaust air damper that is configured to exhaust the heated air from the exhaust air space to the external environment. The system further includes a plurality of computing devices that are arranged within the interior space to partition at least a portion of the supply air space from the exhaust air space. Some, most, or substantially each of the computing devices include a fan that is capable of moving the cool air across one or more heat generating components of the computing device to cool the heat generating components.

The system additionally includes an air filter assembly that is positioned between the supply air space and the computing devices. The air filter assembly is configured to filter the cool air that is supplied to the computing devices from the air supply space. The system also includes a mixing damper that is positioned within the interior space of the facility between the supply air space and the exhaust air space. The mixing damper is operable to control an amount of exhaust air that is supplied from the exhaust air space to the supply air space for mixing with the cool air supplied through the air inlet. Airflow through the system is substantially or entirely driven by the combined airflow of at least a plurality of the fans of the computing devices.

According to another aspect, a method of cooling computing devices within a facility is provided. The facility has an interior space that includes a supply air space and an exhaust air space. The method includes flowing cool air from an external environment through an air inlet of an exterior wall of the facility to supply the cool air to the supply air space. The method also includes flowing the cool air through an air filter assembly to filter the cool air and thereby remove unwanted particles and debris from the cool air. The method further includes flowing the filtered cool air through a plurality of computing devices that are arranged within an interior space of the facility so that the computing devices partition at least a portion of the supply air space from the exhaust air space. Some, most, or substantially each of the computing devices include a fan that is capable of moving the filtered cool air across one or more heat generating components of the computing device to cool the heat generating components and heat the filtered cool air. The heated air flows into the exhaust air space from the computing devices subsequent to cooling the heat generating components. The method additionally includes flowing the heated air through an exhaust air damper to exhaust the heated air from the exhaust air space to the external environment. Airflow of the cool air and the heated air is substantially or entirely driven by the combined airflow of at least a plurality of the fans of the computing devices.

BRIEF DESCRIPTION OF THE DRAWINGS

The present technology is described in conjunction with the appended figures.

Figure 1:
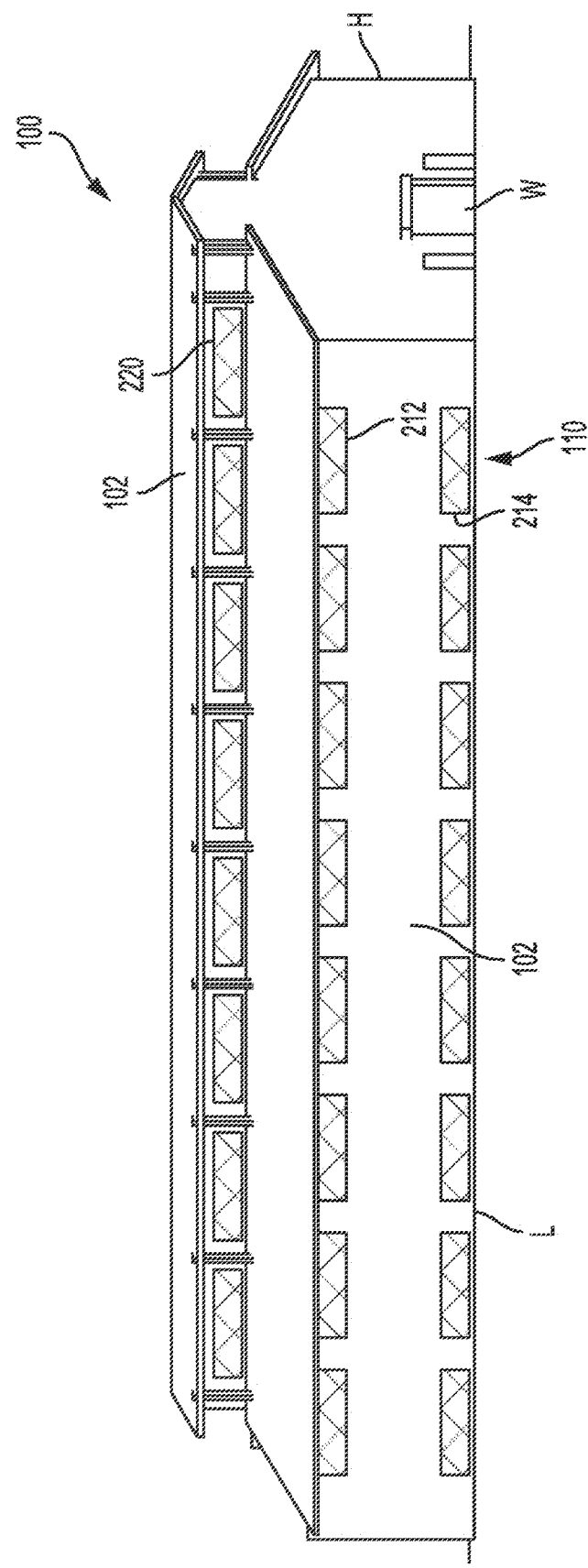
FIG. 1 illustrates an embodiment of a system that is designed to cool computing devices within a facility.

In the appended figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

The ensuing description provides exemplary embodiments only, and is not intended to limit the scope, applicability or configuration of the disclosure. Rather, the ensuing description of the exemplary embodiments will provide those skilled in the art with an enabling description for implementing one or more exemplary embodiments. It being understood that various changes may be made in the function and arrangement of elements without departing from the spirit and scope of the invention as set forth in the appended claims.

The embodiments described herein relate to a system and method for cooling computing devices within a facility. In particular, the system is designed to cool computing devices that are involved in processes related to blockchain technology, such as "mining" or participating in proof-of-work processes that are known in the blockchain art. The system and method may be particularly useful in cooling computing systems that are participating in cryptocurrency mining.

The term computing device as used herein is meant to cover any device that performs computing operations and may include personal computers, servers, host devices, central processing unit (CPU) devices, graphics processing unit (GPU) devices, field programmable gate array (FPGA) devices, application-specific integrated circuit (ASIC) devices, a dedicated mining device, any combination of said devices, and the like.

The systems and method described herein use outside ambient air to cool the computing systems. Unlike traditional systems, the cooling system is not designed to cool the outside air with conventional heating, ventilation, and air conditioning (HVAC) components, such as a compressor, an evaporator coil, a condensing coil, an expansion valve, a cooling room air conditioner (CRAC), a chiller, a cooling tower, direct expansion refrigeration, etc. Rather, 100% of the air that is used in the system is provided from the external environment. The air that is heated by the computing devices may be recirculated and combined with the cool air when the cool air is too cold or when the humidity in the cool air is too high. But the air that is used in the system is not cooled by conventional HVAC systems. As used herein, the term "cool air" refers to air that is supplied from the environment surrounding the facility. The outside air that flows into the facility may be termed "cool air" to differentiate the outside air that enters the facility from the air that remains outside the facility. The cool air is ambient air in the environment and thus, the cool air is the same temperature as the air surrounding the cooling system facility. The temperature of the cool air is lower than the temperature of the computing systems, but may vary drastically depending on the season, weather conditions, and/or other environmental conditions. For example, the temperature of the cool air may vary between 0 and 95 degrees Fahrenheit or more.

In addition, the system typically does not include a dedicated fan, dedicated fans, or a dedicated blowing mechanism that is designed to push air through the system. Rather, the airflow through the system is generated by one or more fans of the computing devices, and typically some combination of computing device fans. The cooling effect of the system is achieved through a combination of the facility design and the combined effect of the computing device fans. Stated differently, the fans of the computing devices (e.g., servers, CPUs, GPUs, etc.) push the air through the system. In such instances, the system does not include any other fans or air moving devices other than the fans of the computing devices. As such, the system is a completely passive system in that the fans of the computing device drive airflow through the system and in that the cooling is achieved via convective cooling from the cool air, which in some instances is recirculated in the system after cooling the computing devices. In other embodiments, the system may include one or more dedicated fans that aid the computing device fans in pushing the air through the system.

Since the airflow through the system is dependent entirely, or essentially entirely, on the computing device fans, the system is designed to minimize pressure losses or pressure drops as the air flows through the system. This is achieved, in part, by maximizing the inflow of air from the environment, and/or the air that is recirculated in the system, and by employing low pressure drop filters, large cross-sectional areas within the facility, and other components. In this manner, the computing device fans do not experience undue stress in pushing the air through the system. The system is also designed to minimize or prevent the formation of vortices, unless explicitly required to counteract airflow stratification, in order to increase and maintain the flow of air through the system.

As briefly mentioned above, the system is further designed so that the heated air may be recirculated within the system and combined with fresh outside air from the external environment. The heated air may be combined with the fresh outside air to treat the fresh outside air to a specific target temperature and/or environmental humidity condition by raising the temperature of the fresh outside air. The system is automated to open one or more dampers, or airflow valves, when the system determines that the temperature of the outside air is too low or that the relative humidity of the outside air is too high. The recirculated air is mixed with the outside air in a mixing chamber. Mixing of the heated air and outside cool air is maximized in a passive manner via the use of one or more turbulators or elongate members, which is a component that is designed to increase turbulent flow of air within the mixing chamber and prevent temperature based airflow stratification. The turbulators may be projections, arms, or other members, that project or extended into the mixing chamber. The surface of the turbulators may be designed to induce turbulent airflow.

Having described several features of the system and method generally, additional aspects and features will be readily apparent in view of the description of the various drawings provided herein below.

Referring now to FIG. 1, illustrated is an embodiment of a system that is designed to cool computing devices within a facility 100. The facility 100 includes a plurality of exterior walls 102 that define the exterior surface of the structure. The facility 100 includes one or more sections 110, and commonly a plurality of sections 110, in which each section 110 is partitioned or divided from an adjacent section 110 and in which each section 110 is designed to cool computing devices within the respective section. FIGS. 2-6 illustrate the sections in greater detail, but as illustrated in FIG. 1, each section 110 typically includes a first air inlet 212, a second air inlet 214, and an air outlet or exhaust 220. The system is essentially modular and the facility 100 may have a length L that is as short as a single section (e.g., 10-12 feet) or that is as long as desired, such as 300 feet or more. The sections 110 in the facility 100 commonly have identical configurations, however, one or more sections 110 within the facility 100 may differ from another section as desired. For example, a facility 100 may include one or more sections having the configuration illustrated in FIG. 2 and may also include one or more sections having the configuration illustrated in FIG. 6.

Figure 2:
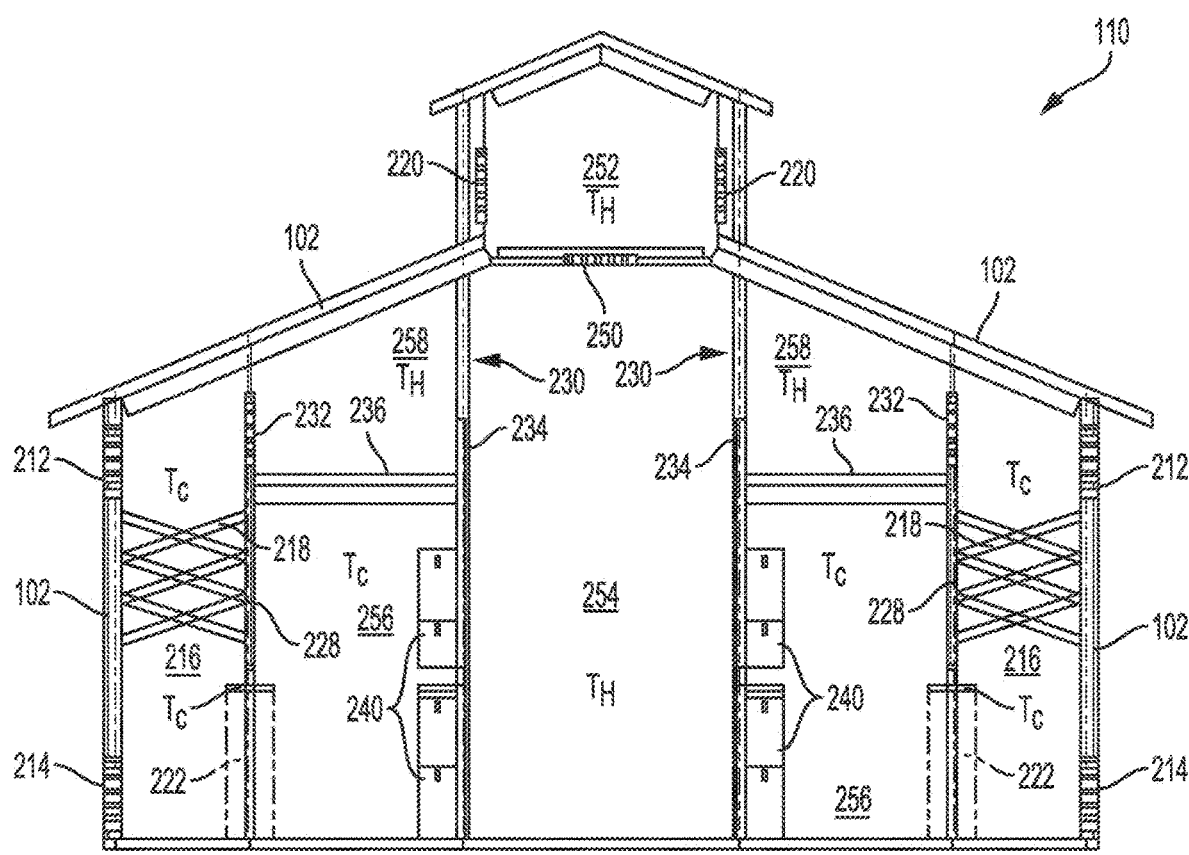
FIGS. 2-3 illustrate an embodiment of a section of the facility of FIG. 1.

As illustrated in FIG. 2, each section 110 has a symmetric design so that the first air inlet 212, second air inlet 214, exhaust 220, computing devices 240, etc. are essentially mirrored about a midpoint of the facility 100. The facility 100 has a width W that may be selected as desired or needed, and which is commonly between 30 and 60 feet, and more commonly between 40 and 50 feet. The facility 100 likewise has a height H that may be selected as desired or needed, and that is commonly between 40 and 50 feet so that the facility 100 is essentially a four story building. In such instances, two of the stories may include the computing devices, a third story may be a space for recirculated exhaust air, and a fourth story may be, or include, the exhaust air outlet 220. It should be realized that the configuration of the facility 100 may be varied depending on need or other conditions.

The facility 100 is oriented in relation to the environment so that the exhaust air is blown away from the facility 100. Specifically, the facility 100 is oriented so that the common prevailing winds are directed to flow along a longitudinal side, or along both longitudinal sides, of the facility 100. This orientation ensures that most or all of the exhaust air does not mix with the ambient or fresh outside air in the environment. Since the exhaust air does not mix with the ambient fresh outside air, the exhaust air is not unintentionally recirculated into the facility 100 via the air inlet 212, which unintentional mixing may raise the temperature of the fresh outside air to an undesirable level, such as above 90 to 100 degrees or more. Positioning of the exhaust outlet 220 at or near the top of the facility 100 aids in ensuring that the exhausted air does not unintentionally mix with the fresh outside air.

The facility 100 is similarly oriented so that the exhaust is blown away from other adjacent facilities (not shown) so as to avoid unintentional mixing of the exhaust air with the fresh outside air that is adjacent to an neighboring facility. In some instances, it may be desirable to ensure that the facility 100 is located in an area that commonly experiences a modest wind, such as between 2-10 miles per hour (mph) or between 4-6 mph. The modest wind may ensure that the exhaust air is blown away from the facility 100 without being overly disruptive to the circulation of air within the facility 100. In selecting a location for the facility 100, and/or an orientation of the facility 100 within a given location, historical weather data may be analyzed to determine common weather conditions (e.g., wind direction, wind speed, high and low temperatures, humidity levels, etc.) within the location to ensure that the location is proper for the passive cooling that the system employs. If the common temperature is too hot, too humid, too windy, and the like, the location may not be suitable for the passive cooling system described herein.

The system may be designed to accommodate local isolated changes in weather. For example, if the local wind is flowing in a more perpendicular direction relative to the longitudinal sides of the facility 100, one or more vents or louvers on the first air inlet 212 and/or second air inlet 214 on the upwind side of the facility 100 may be closed to reduce air pressure on the upwind side of the facility and/or to reduce air swirling or air vortices within the facility 100. The closing of the vents or louvers may also be used to prevent a vacuum from being created on an opposite side of the facility 100. In some instances, baffling may be used with the vents or louvers, or in place of the vents or louvers, to counteract prevailing winds.

Figure 3:
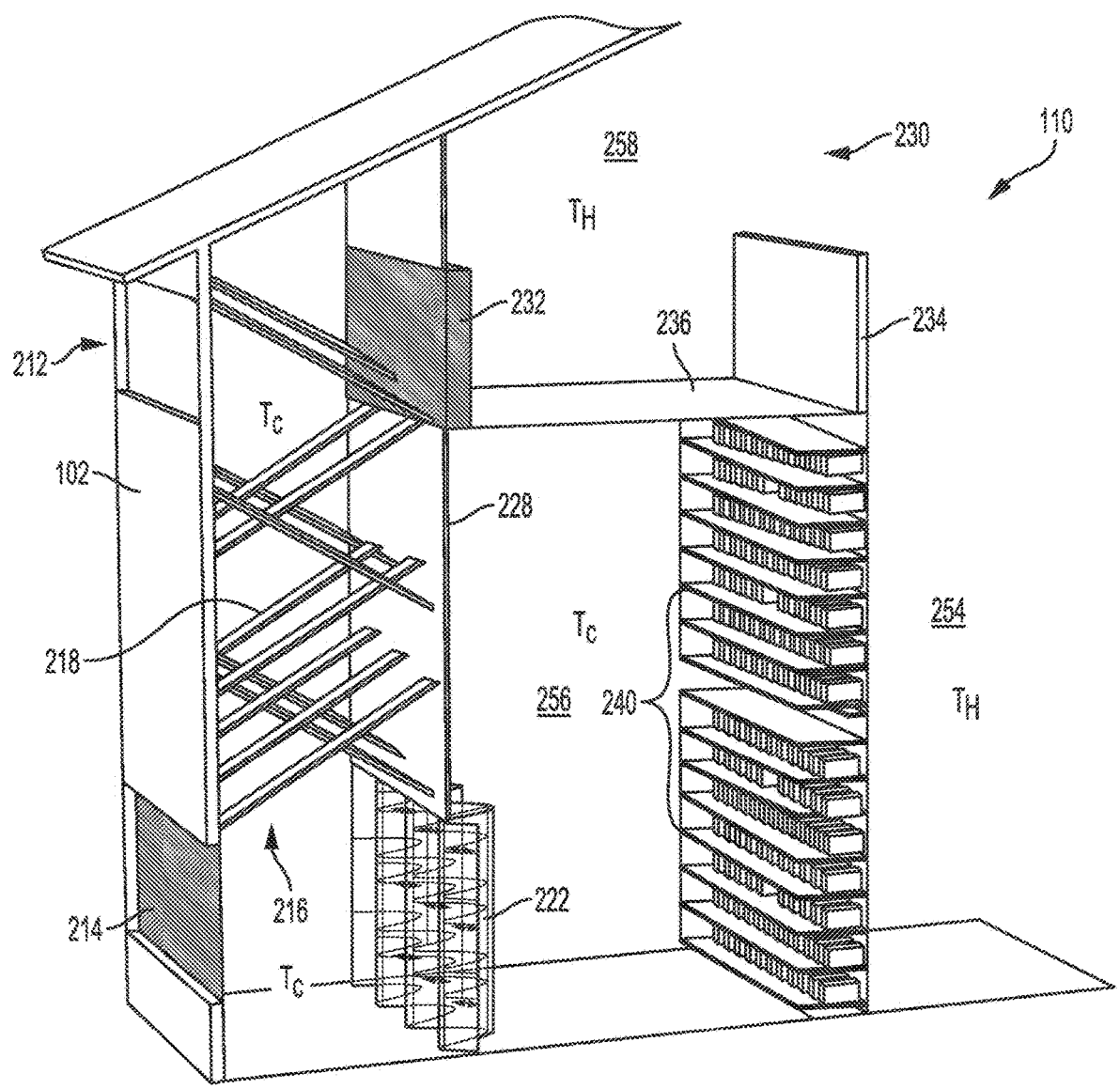

Referring now to FIGS. 2 and 3, illustrated is an embodiment of a section 110 of the facility 100. The section 110 may be any width, but is more commonly between 10-12 feet wide. As briefly described, the facility 100 may include one or more of the sections 110, of which the section 110 of FIGS. 2 and 3 is a representative example. FIG. 2 is a cross sectional view of the facility 100 and illustrates an entire section 110 while FIG. 3 is perspective view of half of the section 110. FIGS. 2 and 3 also illustrate the interior space of the facility 100 and the various components that are positioned within the interior space. In particular, the section 110 includes a supply air space, or cool air aisle, that is defined as the space between the first air inlet 212, the second air inlet 214, and the computing devices 240. The supply air space, or cool air aisle, includes a mixing chamber 216 and a computing space 256. The computing space 256 is partitioned or divided from the mixing chamber 216 by an interior wall 228 and filter structure 222. The supply air space, or cool air aisle, includes cool air Tc that is supplied to the computing devices 240 to cool the computing devices 240 during operation of the devices. The cool air Tc is typically outside air that is supplied through the first or second air inlets, 212 and 214, which may or may not be mixed with exhaust air as described herein.

The section 110 also includes an exhaust air space, or hot air aisle, that is defined as the space between the computing devices 240, a mixing damper 232, and the exhaust air outlet 220. The exhaust air space, or hot air aisle, includes a main exhaust air space 254, a recirculated hot air space 258 (hereinafter recirculated air space 258), and a vent air space 252. The exhaust air space, and in particular the main exhaust air space 254 and the vent air space 252, are configured to exhaust heated air Tx from the computing devices 240 to the external environment via exhaust outlet 220. The recirculated air space 258 is typically positioned above the computing space 256 and is partitioned or divided from the computing space 256 via a floor 236. The floor 236 is a solid floor material that is impermeable to air in order to ensure that the cool air Tc does not flow into the recirculated air space 258.

The recirculated air space 258 is also divided from the mixing chamber 216 via a mixing damper 232 that is positioned on an exterior end of the recirculated air space 258. In some embodiments, a wall or other partition may extend vertically upward from the mixing damper 232 to divide the recirculated air space 258 from the mixing chamber 216. As described in greater detail herein, the mixing damper 232 may be opened to allow exhaust air TH to flow into the mixing chamber 216 for mixing with the cool air Tc, or the mixing damper 232 may be closed to prevent the heated air TH from flowing into the mixing chamber 216. In this manner, the mixing damper 232 is operable to control an amount of exhaust air TH that is supplied from the main exhaust air space 254 to the supply air space for mixing with the cool air Tc supplied through the first air inlet 212. The mixing damper 232 may have various dimensions, but is commonly between 3 and 8 feet high and 4-12 feet wide. In a specific embodiment, the mixing damper 232 is approximately 4 feet high and 8 feet wide.

The vent air space 252 may be divided from the main exhaust air space 254 via a damper or vent 250, which may be opened to allow the heated air TH to vent to the external environment or that may be partially or fully closed to force heated air TH into the recirculated air space 258 for mixing with the cool air Tc. The damper 250 and/or exhaust outlet 220 may be similarly sized to the mixing damper 232, although the damper 250 is typically larger than the exhaust outlets 220 due to the damper 250 typically venting considerably more air than either exhaust outlet 220. In some embodiments the damper 250 may not be included in the section 110. Rather, the section 110 may only include the exhaust outlet 220. In other embodiments, the section 110 may not include the exhaust outlet 220 and instead may only include the damper 250, which may be used to control and regulate exhausting of the heated air TH and/or recirculation of the heated air TH within the section 110. When the section 110 includes both the damper 250 and the exhaust outlet 220, louvers or other airflow control are typically only included in the damper 250 and the exhaust outlet 220 is open. The vent air space 252 typically has a width that corresponds to the width of the main exhaust air space 254 or is slightly larger than the main exhaust air space 254. In a specific embodiment, the vent air space 252 has a width of approximately 13 feet. The vent air space 252 may be designed to vent a considerable amount of air, such as between 40,000 and 60,000 cubic feet per minute (CFM) of exhaust air TH. Accordingly, the height and width of the vent air space 252 and the size of the damper 250 and/or exhaust outlets 220 are typically selected to vent this volume of air, although the exact dimensions may be selected to vent less air as required by the design and intended use of the section 110. The pitch of the roof above the vent air space 252, and/or in other portions of the section 110, may be 5/12 pitch.

A space 230 between the recirculated air space 258 and the main exhaust air space 254 is open so that the recirculated air space 258 is in fluid communication with the main exhaust air space 254. The open space 230 ensures that the heated air TH is able to flow from the main exhaust air space 254 to the recirculated air space 258 and to the mixing damper 232. A vertically oriented parapet or partition 234 extends upward from the floor 236 of the recirculated air space 258 to partially divide or partition the recirculated air space 258 from the main exhaust air space 254. The partition 234 aids in guiding the heated air TH in a vertical direction and minimizes the formation or vortices that may otherwise occur in the recirculated air space 258 and in which the heated air TH may continuously circulate. The partition 234 may extend upward from the floor 236 between 1 and 6 feet, and more commonly between 2 and 4 feet.

The computing devices 240 partition the computing space 256 from the main exhaust air space 254. The computing devices 240 form a wall between the computing space 256 and the main exhaust air space 254, or are positioned or housed on a wall between the computing space 256 and the main exhaust air space 254. A distance between opposing walls of the computing devices 240 may be between 5 and 20 feet, but is more commonly between 10 and 14 feet. In a specific embodiment, the distance between opposing walls of the computing devices 240 is approximately 12 feet. The main exhaust air space 254 may similarly be between 5 and 20 feet, and more commonly between 10 and 14 feet. In a specific embodiment, the main exhaust air space may be approximately 12 feet. The main exhaust air space 254 is also typically between 15 and 50 feet tall, and more commonly between 20 and 40 feet tall.

At least some of the computing devices 240 include a fan that is capable of moving the cool air Tc across one or more heat generating components of the computing devices 240 to cool the heat generating components. In some embodiments, most of the computing devices 240, or all of the computing devices 240, include a fan that moves the cool air Tc across the heat generating component(s). Each of the fans is oriented so that the air flows from the computing space 256 to the main exhaust air space 254. The computing devices 240 are oriented or arranged relative to one another, and/or in relation to the wall that partitions the computing space 256 from the main exhaust air space 254, so that the air is able to flow from the computing space 256 into the main exhaust air space 254, but is prevented from flowing from the main exhaust air space 254 into the computing space 256. Stated differently, the computing devices 240, and/or wall, partition the computing space 256 from the main exhaust air space in a relatively air tight manner so that a flow of air from the main exhaust air space 256 to the computing space 254 is negligible. In this manner, the cool air Tc is forced across the heat generating component(s) of the computing devices 240 and is heated by the heat generating component(s). The heated air Tx flows into the main exhaust air space 254 and is exhausted from the section 110 or is recirculated within the section 110 as described herein.

The dimensions of the computing space 256 may be varied as desired. For example, in some embodiments the computing space 256 may be a single floor or story of the section 110, while in other embodiments, the computing space 256 may be multiple floors or stories of the section 110. In FIGS. 2 and 3 the computing space 256 is two floors or stories of the facility 100 and is roughly 10-12 feet wide and 15-22 feet high. The computing devices 240 may be arranged in any manner within the computing space 256, but are more commonly arranged in rows and columns. The computing space 256 may include essentially any number of computing devices, such as between 50 and 200 devices, although between 120 and 180 computing devices is more common. In the illustrated embodiment, each row includes roughly 12 computing devices and the computing space 256 includes approximately roughly 14 rows. This arrangement results in roughly between 150 and 170 computing devices, although this arrangement is for illustrative purposes only and is not meant to be limiting in any manner. As a person of skill will readily recognize, more or fewer computing devices may be employed as desired and the arrangement and number is dependent in part on the size of the computing devices.

As briefly mentioned above, airflow through the section 110 is substantially driven by the combined airflow of a plurality of the computing device fans. More commonly, the airflow is driven entirely by the fans of the computing device so that the section 110 is free of any other air moving device, such as a dedicated fan or blowing mechanism. Stated differently, the computing device fans may be the only devices or mechanisms within the section 110 that move or blow the air through the section 110. While the fans of each computing device 240 are typically utilized to drive airflow through the section 110, the system does not require that the fan of each computing device 240 be operated to drive a sufficient airflow through the section 110. Rather, it should be appreciated that some of the fans may not be operated and/or that some of the computing devices 240 may not include fans or other air moving devices or components at all. All of the computing device fans, or substantially all of the computing device fans, are typically operated to move air through the section 110 since the operation of less than 100% of the fans may create areas where backflow occurs, such as the exhaust air flowing backward into the computing device space. The computing devices 240 may be robust machines that are tolerant to variations in the temperature and thus, changes in airflow due to the amount of fans being used to drive the airflow may not substantially negatively impact the operation of the computing devices 240.

The combined effect of the computing device's fans may result in a considerable volume of air being moved through the section 110. For example, the combined computing device fans may move more than 10,000 CFM of air through the section 110. The section 110 design that is illustrated in FIGS. 2 and 3 may move between 40,000 and 60,000 CFM of air through the section. In a specific embodiment, the section 110 of FIGS. 2 and 3 may move approximately 54,000 CFM of air with each half of the section 110 moving approximately 27,000 CFM of air. The exhaust outlet 220, damper 250, mixing damper 232, and/or first and second air inlets, 212 and 214, are sized to accommodate this large volume of air movement. Each of these components may be configured to allow airflow through the respective component at an airspeed of between 300 and 600 feet per minute, and more commonly between 400 and 500 feet per minute.

As briefly mentioned above, cool air Tc is able to flow into the section 110 via the first air inlet 212 and the second air inlet 214. The first and second air inlets, 212 and 214, may have various dimensions, but are commonly between 3-5 feet high and 8-12 feet wide. In a specific embodiment, the first and second air inlets, 212 and 214, are approximately 4 feet high and 8 feet wide. The second air inlet 214 is positioned vertically below the first air inlet 212.

The first air inlet 212 typically does not include a damper or other closable vent and as such, outside air is essentially always able to flow through the first air inlet 212 into the interior of the section 110. However, the first air inlet 212 typically does include a static louver, mesh screen, or other component that prevent animals or debris from accessing the interior of the section 110. Unlike the first air inlet 212, the second air inlet 214 includes a damper or closable vent. The damper is used to open the second air inlet 214 when airflow through the second air inlet 214 is desired and is also used to close the second air inlet 214 when airflow through the intake is not desired. The damper may be partially or fully closed to control the flow of air through the second air inlet 214. The damper is commonly closed when the mixing damper 232 is opened to combine the heated air TH with the cool air Tc. The degree of closure of the second air inlet's damper may be correlated with the degree of openness of the mixing damper 232 to achieve a desired mixing ratio of heated air TH and cool air Tc. In this manner, a finite and constant amount of air may flow into and through the mixing chamber 216. The opening and closing of the second air inlet's damper is further described in relation to FIGS. 4-5.

An air filter 222 is positioned between the mixing chamber 216 and the computing space 256. The air filter 222 is configured to filter the cool air Tc that is supplied through the first and/or second air inlets, 212 and 214. The air filter 222 is illustrated as being a vertical wall that is coupled with a bottom end of the interior wall 228 and a floor of the facility 100, but the air filter 222 may be placed essentially anywhere between the mixing chamber 216 and the computing space 256 and/or have any orientation desired. The air filter 222 is commonly 8-12 feet wide and approximately 6-12 feet tall. The width and height of the air filter 222 may be varied depending on a required or desired pressure drop with larger cross-sectional areas of the filter 222 resulting in a lower pressure drop. The air filter 222 may be aligned with the second air inlet 214 so that when opened, air is able to flow directly from the second air inlet 214 and through the air filter 222. Alignment of the air filter 222 and the second air inlet 214 is not required in the section 110.

The air filter 222 is commonly an accordion or pleated filter, which maximizes the available surface area for filtering the cool air Tc and minimizes the pressure drop or loss across the air filter 222. Since the airflow through the systems is dependent mostly or entirely on the combined airflow of the computing device's fans, minimizing the pressure drop across the air filter 222 is more important than in conventional systems that have dedicated high output fans or blower mechanisms. An air filter 222 that is designed to remove debris or particles too small may overly burden the computing device's fans, which may cause the computing devices 240 to prematurely fail. An air filter with a minimum efficiency reporting value (MERV) rating of between 7-8 has been found to provide a sufficient degree of air filtering and an acceptable pressure drop. Accordingly, the air filter 222 commonly has a MERV rating of between 7 and 8. As illustrated in FIGS. 2 and 3, in some embodiments, only a single air filter 222 is employed to filter the cool air Tc. In other embodiments, additional air filters may be employed and positioned within the section 110 to filter the cool air Tc. The use of multiple filters may reduce the MERV rating that is required for a single air filter.

The mixing shaft or chamber 216 is positioned downstream of the first air inlet 212 and the mixing damper 232. The mixing chamber 232 is configured to create turbulent airflow as the air flows vertically downward through the mixing chamber 232. The turbulent airflow promotes and substantially increases mixing of the exhaust air TH and cool air Tc. Without turbulence in the mixing chamber 216, the airflow may stratify, resulting in a layer of exhaust air TH and cool air Tc with little intermixing between the layers due to temperature based airflow stratification. Stratified airflow may result in drastic temperature differences in the air that is supplied to the computing devices 240 to cool the devices, which may lead to overheating or overcooling some devices. To create turbulent airflow within the mixing chamber 212, the mixing chamber 212 includes a plurality of turbulators or elongate members 218 that project into the mixing chamber 216. The elongate members 218 may be relatively long and thin components that project or extend into the mixing chamber 216. In some embodiments, the elongate members 218 may be between 2 and 12 feet long, and more commonly between 4 and 10 feet long. The elongate members 218 may also be between 3 and 12 inches wide and more commonly between 4 and 8 inches. Various other dimensions for the elongate members 218 may also be employed. Each of the elongate members 218 may have a uniform or similar configuration or may have different configurations—either in size and/or orientation within the mixing chamber 216. Differently sized and/or oriented elongate members 218 within the mixing chamber 216 may increase the turbulence that is created within the mixing chamber 216.

In some embodiments, opposing ends of the elongate members 218 may be attached to opposing, or different walls, within the mixing chamber 216. In such embodiments, a middle portion of the elongate members 218 may project into the interior of the mixing chamber 216. In other embodiments, a single end of the elongate member 218 may be attached to a wall of the mixing chamber 216. In such embodiments, the other end of the elongate member 218 may terminate within the mixing chamber 216. The mixing chamber 216 may include a combination of elongate members 218 that are attached at opposing ends with the walls of the mixing chamber 216 and elongate members 218 that are attached at only one end with a wall of the mixing chamber 216. Similarly, the elongate members 218 may be diagonally oriented within mixing chamber 216 or may have other orientation, such as substantially horizontal. The orientation of the elongate members 218 within the mixing chamber 216 is typically random to increase the turbulent flow of air through the mixing chamber 216. As such, some of the elongate members 218 are commonly more horizontally oriented in comparison with other elongate members 218 within the mixing chamber 216.

The elongate members 218 are passive devices, which means that they are not electrically or mechanically moved within the mixing chamber 216. Rather, they are static objects that are strategically positions to force the air to pass and flow around the objects.

The flow of air around the objects causes turbulent airflow as opposed to laminar airflow, which substantially increases the mixing of the air—i.e., cool air Tc and exhaust air Tx—within the mixing chamber 216 as the air flows downward and through the mixing chamber 216. In some embodiments, the exterior surface of the elongate members 218 may be configured to increase the turbulent airflow. For example, the exterior surface may be textured, rough, or otherwise configured to increase skin friction or drag, which may greatly increase the turbulent flow in the mixing chamber 216. In some embodiments the mixing chamber 216 may be roughly 8 feet wide per unit length, although the size of the mixing chamber 216 may be varied as desired or required. In some embodiments, the right side of chamber 216 may be compartmentalized. The elongate member 218 are further configured so that when the mixing damper 232 is closed and the first and second air inlets, 212 and 214, are open, the elongate members 218 do not impede the flow of air through the section.

Figure 6:
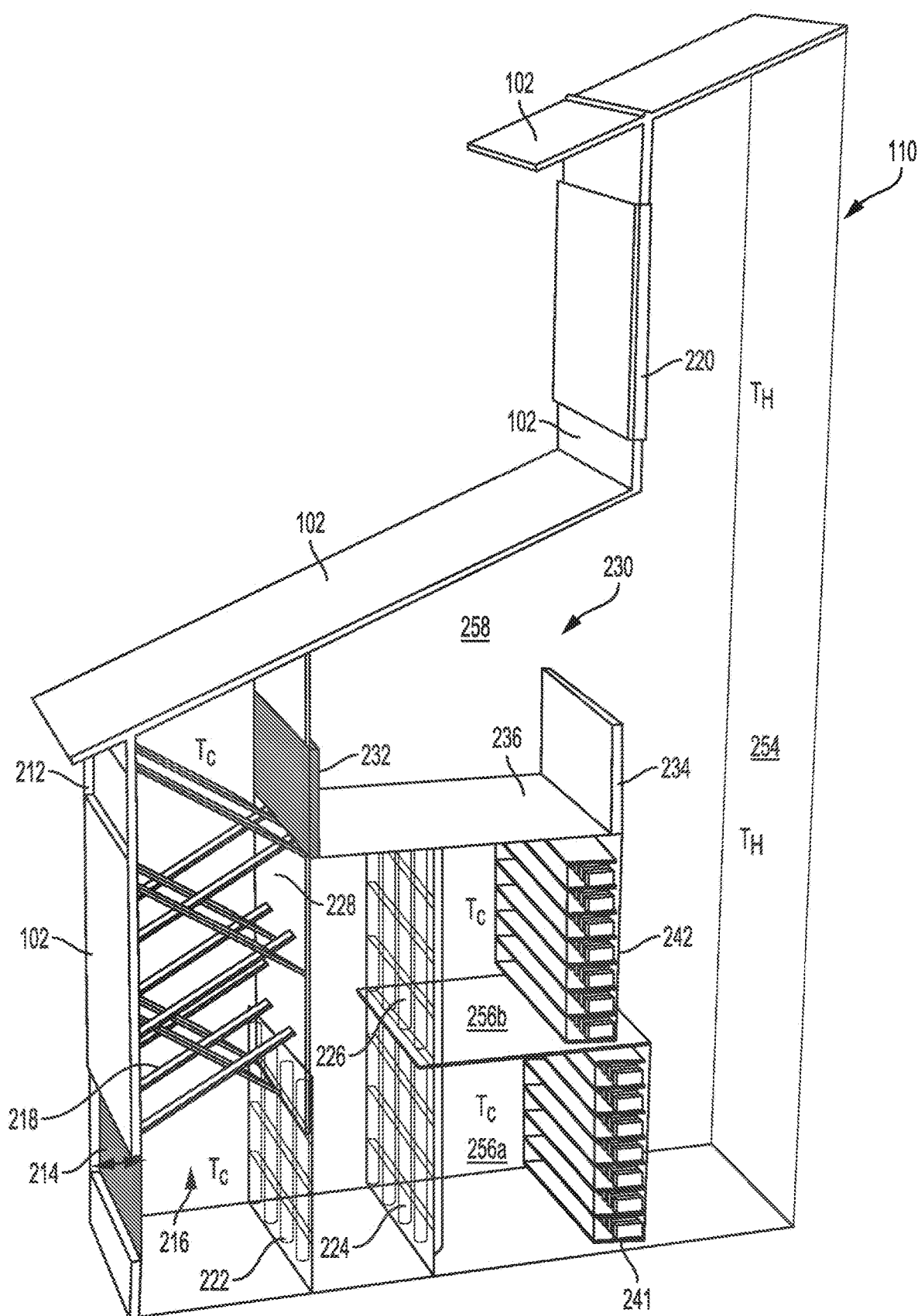
FIG. 6 illustrates another embodiment of a section of the facility of FIG. 1.

Referring now to FIG. 6, illustrated is another embodiment of a section 110 that may be employed within a facility 100. The section 110 is substantially similar to the section 110 illustrated in FIGS. 2 and 3 except that the damper 250 is removed and the section 110 includes two floors of computing devices. Specifically, the section 110 includes a first computing floor 256a having a first wall of computing devices 241 and a second computing floor 256b having a second wall of computing devices 242. The first computing floor 256a is separated from the second computing floor 256b by a floor, which may be made of an air permeable material, such as a mesh type material. As such, the cool air Tc is able to flow between the first computing floor 256a and the second computing floor 256b relatively unobstructed. Additional air filters, 224 and 226, may optionally be positioned to filter the cool air Tc that flows into the first computing floor 256a and the second computing floor 256b. The additional air filters, 224 and 226, may extend between the floor 236 and the floor of the facility and may be coupled with the floor that separates the first computing floor 256a and the second computing floor 256b. The additional air filter, 224 and 226, may also sized and/or configured similar to the air filter 222 e.g., may have a similar MERV rating.

Figure 4:
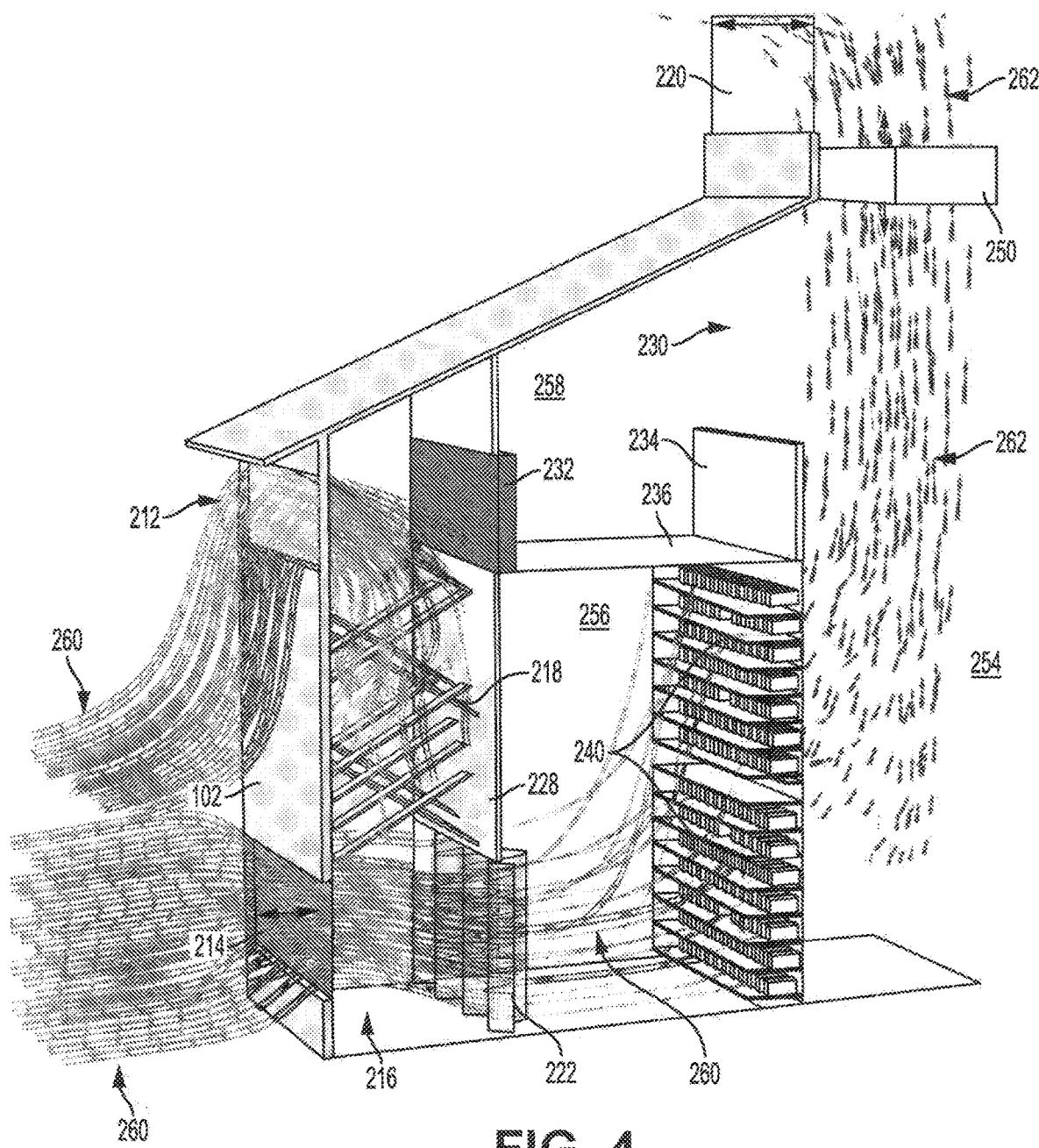
FIG. 4 illustrates an embodiment of airflow through the section of FIGS. 2-3 in which exhaust air is not recirculated within the section.

In some embodiments, the wall that is formed or defined by the second computing devices 242 (hereinafter second wall) is laterally offset from the wall that is formed or defined by the first computing devices 241 (hereinafter first wall). For example, the second wall may be laterally offset from the first wall by between 6 and 24 inches and more commonly about 18 inches. When a width between the opposing first walls is 12 feet as described above, an offset of 18 inches between the second wall and the first wall would result in a width between the opposing second walls of approximately 15 feet. The offset between the first wall and the second wall may be selected as desired and may be used to accommodate an extra volume of heated air that flows upward toward the exhaust outlet 220 from the second walls. While FIG. 6 only illustrates ½ of the section 110, it should be appreciated that the other non-illustrated half typically has a mirrored configuration to the illustrated section. [0045] Referring now to FIG. 4, illustrated is the airflow through the section 110 of FIGS. 2 and 3 in which exhaust air 262 is not recirculated within the section 110. The airflow that is illustrated in FIG. 4 may correspond to a typically airflow through the section 110 in warmer months in which the outside air is cool enough to cool the computing devices 240, but not too cold to require mixing of the heated exhaust air 262 and not to humid to require mixing of the heated exhaust air 262. In the illustration of FIG. 4, the exhaust outlet 220 and/or damper 250 are maintained fully open so that substantially all of the exhaust air 262 is exhausted or vented to the external environment. The exhaust air 262 is illustrated as flowing upward from the computing devices 240 and out of the damper 250 and exhaust outlet 220. The mixing damper 232 is maintained closed so that substantially none of the exhaust air 262 flows into the mixing chamber 216 as illustrated in FIG. 4.

The second air inlet 214 is maintained fully open so that the cool outside air 260 (hereinafter cool air 260) is able flow through both the first air inlet 212 and the second air inlet 214. Each of the air inlets, 212 and 214, are sized so that approximately ½ of the air volume flows through each air inlet. The cool air 260 flows through the air inlets and through the filter 222 to the computing devices 240 where the cool air 260 is warmed by the heat generating components. The heated cool air 260 then flows into the main exhaust air space 254 as exhaust air 262. The airflow through the system is typically driven entirely by the fans of the computing devices 240 as previously described, although in some embodiments one or more dedicated fans or blowing mechanism may aid in moving the air through the system.

It should be appreciated that FIG. 4 is provided for illustrative purposes and that the second air inlet 214, the exhaust outlet 220, and/or the damper 250 may be incrementally or partially closed so that only some fraction of a maximum airflow of cool air 260 is delivered through the second air inlet 214 and so that some fraction of a maximum airflow of exhaust air 262 is vented from the facility. The mixing damper 232 may likewise be incrementally or partially opened so that some fraction of a maximum airflow of exhaust air 262 is delivered through the mixing damper 232 to the mixing chamber 216 for mixing with the cool air 260 that flows through the first air inlet 212.

The dimensions of the section 110 are typically dependent on the desired or required airflow through the system. For example, the size of the main exhaust air space 254, the size of the air filter 222, and the size of the air inlets, dampers, and outlets are all dependent on the airflow that is expected within the section 110. For example, as described above, the section 110 may be configured to accommodate an airflow of approximately 54,000 CFM, or 27,000 CFM for ½ of the section 110. Given this airflow, the exhaust outlet 220 should be capable of venting or exhausting all of the airflow (e.g., 27,000 CFM at around 500 feet per minute) since in some embodiments all of the exhausted air will be vented from the facility 100. The exhaust outlet 220 may be roughly 8 feet wide and 7 feet tall to exhaust this volume of air at the desired air speed.

The first air inlet 212 is typically sized smaller than the exhaust outlet 220 since the volume of air that flows through the first air inlet 212 is typically less than the volume of air that flows through the exhaust outlet 220 due to the use of the second air inlet 214 and/or the mixing damper 232. The first air inlet 212 is commonly an open penetration with a mesh guard and no movable louvers. The first air inlet 212 typically remains open regardless of the external weather conditions, although preparations may exist to close the first air inlet 212 when necessary. The second air inlet 214 is also typically sized smaller than the exhaust outlet 220 since the volume of air that flows through the second air inlet 214 is less than the volume of air that flows through the exhaust outlet 220 due to the use of the first air inlet 212. A cross-sectional area of the exhaust outlet 220 will typically be equal to or larger than a combined cross-sectional area of the first and second air inlets, 212 and 214, or a combined cross-sectional area of the first air inlet 212 and the mixing damper 232 since the volume of air entering and exiting the section 110 must be equal. A cross-sectional area of the first air inlet 212, the second air inlet 214, and the mixing damper 232 is roughly equal since roughly half of the air entering the section 110 is provided by the first air inlet 212 and the other half of the air entering the section 110 is provided by the second air inlet 214, the mixing damper 232, or a combination of the second air inlet 214 and mixing damper 232. A cross-sectional area of the damper 250 is twice the size of the cross-sectional area of the exhaust outlet 220 or larger since the damper 250 is used to vent exhaust air from both sides of the section and to vent exhaust air to a pair of exhaust outlets 220—i.e., the damper 250 accommodates both sides of the section 110. The second air inlet 214 includes louvers, closable vents, or other components that allow the second air inlet 214 to be partially or fully closed to impede or prevent airflow through the second air inlet 214. The louvers may be electronically controlled variable frequency drive components.

The first and second air inlets, 212 and 214, may each be sized so that approximately 50% of the maximum air flow of the exhaust outlet 220 (e.g., 27,000 CFM) is deliverable through each air inlet. Using the example above, approximately 13,500 CFM of airflow may be delivered through the first air inlet 212 and an additionally 13,500 CFM may be delivered through the second air inlet 214. The airflow may be provided at a max air speed of around 421 feet per minute, which is roughly approximate to the max air speed through the exhaust outlet 220. The first and second air inlets, 212 and 214, may be roughly 8 feet wide and 4 feet tall to deliver this desired air flow.

As briefly described above, the mixing damper 232 may be opened and the second air inlet 214 may be closed to force some of the exhaust air 262 to flow through the mixing damper 232 and into the mixing chamber 216, where it is mixed with the cool air 260. The mixing damper 232 and the second air inlet 214 may be paired so that the degree of closure of the second air inlet's damper may be correlated with the degree of openness of the mixing damper 232. The pairing of the mixing damper 232 and second air inlet 214 allows a desired mixing ratio of cool air 260 and exhaust air 262 to be achieved. In some embodiments, the mixing damper 232 and the second air inlet 214 are paired in a 1 to 1 ratio so that openness of one component directly corresponds to the closure of the other component. For example, when the mixing damper 232 is 25% open, the second air inlet 214 may be 25% closed and when the mixing damper 232 is 75% open, the second air inlet 214 may be 75% closed. The amount of openness of one component and the amount of closure of the other component may vary by any amount between 0% and 100%. As such, some amount or volume of air may simultaneously flow through the first air inlet 212, the second air inlet 214, and the mixing damper 232.

The damper 250 or exhaust outlet 220 may also be partially closed to increase air pressure within the main exhaust air space 254 and within the recirculated air space 258 and thereby force the exhaust air 262 through the mixing damper 232. In some embodiments, the degree of closure of the damper 250 or exhaust outlet 220 may be correlated with the degree of openness of the mixing damper 232 and the degree of closure of the second air inlet 214. The damper 250 is typically employed to regulate the airflow through the mixing damper 232. In a specific embodiment, the degree of closure of the damper 250 may be correlated with the degree of openness of the mixing damper 232 so that the damper 250 closes roughly ½ of the amount that the mixing damper 232 opens. This degree of closure of the damper 250 may create the necessary back pressure to develop within the recirculated air space 258 to force the exhaust air 262 to flow through the mixing damper 232 and into the mixing chamber 216. As previously described, the second inlet 214 may also close by the same amount that the mixing damper 232 opens, which likewise aids in forcing the exhaust air 262 to flow through the mixing damper 232 and into the mixing chamber 216. In some embodiments, the exhaust outlet 220 may be partially or fully closed without opening the mixing damper 232 in order to increase an internal temperature within the section 110 and facility 100.

The mixing damper 232 may be opened to recirculate the exhaust air 262 within the system in order to increase the temperature of the cool air 260, such as during the winter months, or to reduce a humidity in the cool air 260, such as during humid conditions in the warmer months. The mixing damper 232, second air inlet 214, and exhaust damper 220 are typically controlled via a control system (not shown) of the facility 100. The control system includes a processor, memory, and one or more sensors that are configured to sense conditions within the facility 100 and/or external to the facility 100, such as the cool air temperature, the external humidity levels (relative and/or absolute humidity), the internal air temperature, the internal humidity levels (relative and/or absolute humidity), the airflow through the facility, the exhaust gas air temperature, the pressure differential within the system and/or across one or more components, and the like. The sensors communicate this information to the processor and the processor analyzes the information and responds accordingly by opening or closing the various dampers, vents, outlets, and intakes. For example, when the processor determines that the cool air 260 is too cold, the processor responds by sending appropriate instructions to open the mixing damper 232 and simultaneously close the second air inlet 214 and/or exhaust outlet 220. A similar process may occur when the processor determines that the relative humidity in the air is too high. Conversely, when the processor determines that the internal air is too hot and/or the cool air is cool, but not too cold, the processor responds by sending appropriate instructions to close the mixing damper 232 and open the second air inlet 214 and/or exhaust outlet 220. In this manner, the control system is able to modulate the conditions within the facility via information about the cool air and weather conditions and/or via information about the conditions within the facility 100. The control system, including the processor and memory, may be an onsite system that is housed within or near the facility 100 or may be a remote system, such as a cloud computing based system. The control system may monitor one or more facilities and one or more sections within each facility and modulate the conditions within each section and within each facility as needed.

In regards to the mixing damper 232, the mixing damper typically includes electronically controlled louvers that have a variable frequency drive capability. The mixing damper 232 may be sized to vent roughly 60% of the maximum air flow of the exhaust outlet 220 (e.g., 27,000 CFM). The airflow through the mixing damper 232 may be provided at a max air speed of around 500 feet per minute, which is roughly approximate to the max air speed through the exhaust outlet 220. Using the example above of an airflow of 27,000 CFM through the exhaust outlet 220, the mixing damper 232 may be configured to vent approximately 16,200 CFM of air. The mixing damper 232 may be roughly 8 feet wide and 4 feet tall to deliver this desired air flow.

As briefly described above, the mixing damper 232 may be opened to increase the temperature of the cool air 260 and/or to reduce a relative humidity of the cool air 260. For example, if the outside air temperature is 40 degrees Fahrenheit, the mixing damper 232 may be opened to allow the exhaust air 262 to flow into the mixing chamber 216 and mix with the cool air 260. Regardless of the temperature of the exhaust air 262, the system may expose the cool air 260 to the exhaust air 262 via the mixing damper 216 to achieve a desired treated air condition, such as a temperature that is effective to cool the computing devices to between 60 and 90 degrees Fahrenheit in accordance with ASHRAE TC9.9 environmental standards. The mixing damper 232 may be incrementally closed and/or the second air inlet 214 may be incrementally opened as the outside air temperature nears an ideal cooling temperature, such as a temperature that is effective to cool the computing devices to between 60 and 90 degrees Fahrenheit in accordance with ASHRAE TC9.9. When the outside air temperature reaches the ideal cooling temperature, the mixing damper 232 may be fully closed so that the system is cooled entirely by the outside air. Similarly, as the outside air temperature drops below the ideal cooling temperature, the mixing damper 232 may be incrementally opened and/or the second air inlet 214 may be incrementally closed until the mixing damper is fully opened and/or the second air inlet is fully closed. The relatively humidity in the air may likewise be reduced via the introduction of the exhaust air 262 to the cool air 260. In this manner the humidity of the cool air 260 may be modulated to a level that is in accordance with ASHRAE TC9.9 environmental standards.

Figure 5:
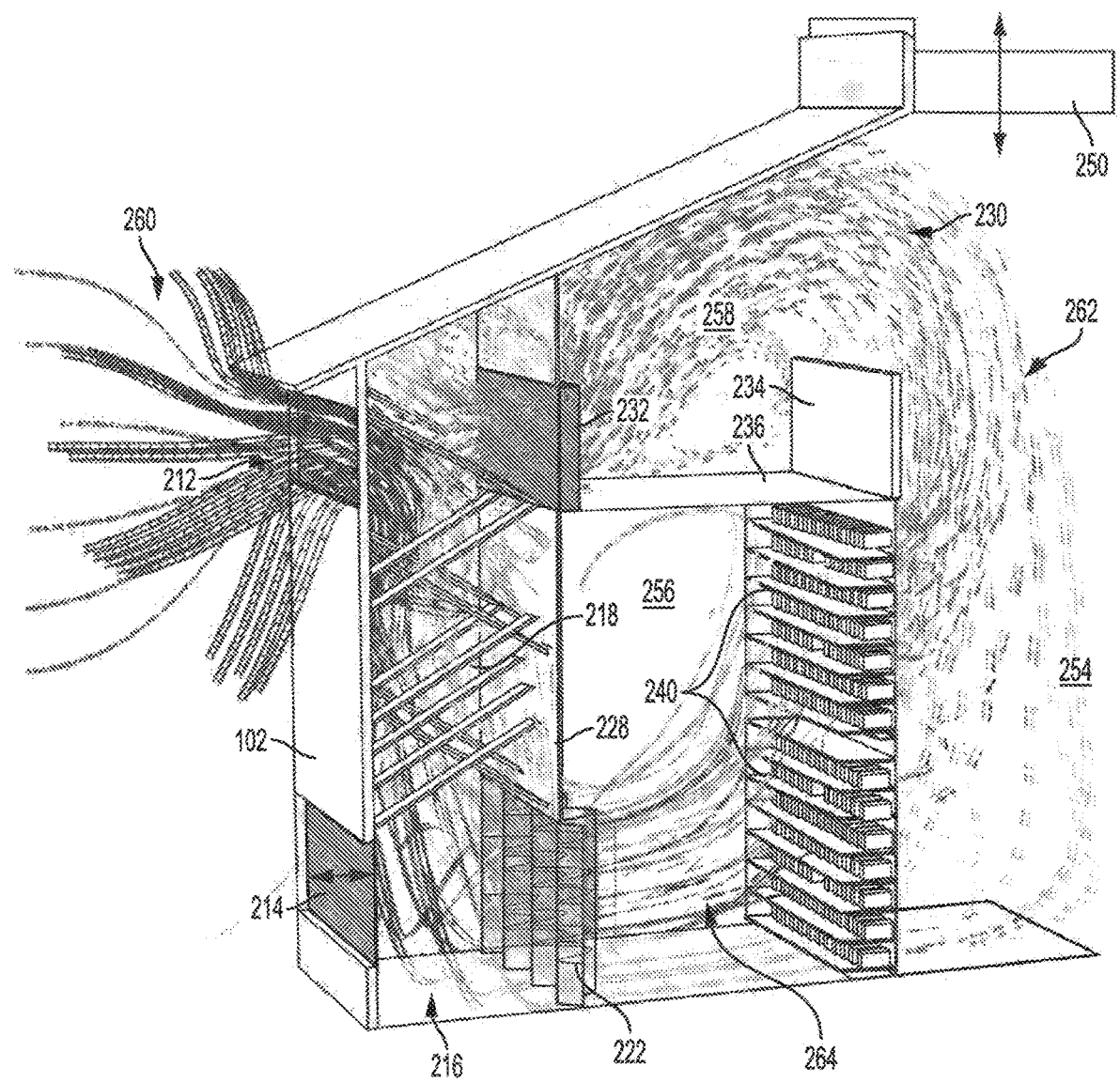
FIG. 5 illustrates an embodiment of airflow through the section of FIGS. 2-3 in which exhaust air is recirculated within the section.

Referring now to FIG. 5, illustrated is the airflow through the section 110 of FIGS. 2 and 3 in which the exhaust air 262 is recirculated within the section 110. The airflow that is illustrated in FIG. 4 may correspond to a typically airflow in the cooler or cold months in which the cool air 260 is too cold to adequately cool the computing devices 240, or in which the cool air 260 is below an ideal cooling temperature. The relative humidity of the cool air 260 is typically not a concern during this time period since the cool air 260 will be warmed by the exhaust air 262. In the illustration of FIG. 5, the exhaust outlet 220 and/or damper 250 are fully closed so that substantially all of the exhaust air 262 flows into the recirculated air space 258 and through the mixing damper, which is illustrated as being fully opened. The exhaust air 262 is illustrated as flowing upward and into the recirculated air space 258 and through the mixing damper 232 into the mixing chamber 216.

The second air inlet 214 is fully closed so that substantially none of the cool air 260 is able flow through the second air inlet 214 and instead is forced to flow through the first air inlet 212. The cool air 260 is forced to flow through the first air inlet 212 so that the cool air 260 and the exhaust air 262 are subjected to the mixing chamber 216 and the elongate members 218, which mixes the cool air 260 and the exhaust air 262 via the passive creation of turbulent flow. If the second air inlet 214 were opened, a substantial portion or volume of the cool air 260 would flow through the second air inlet and may not properly mix with the exhaust air 262. The mixed cool air 260 and exhaust air 262 (hereinafter heated air 264) flows through the air filter 222 to the computing devices 240 where the heated air 264 cools the heat generating components as the heated air 264 flows through the computing devices 240 and into the main exhaust air space 254. The heated air 264 is further heated by the heat generating components and enters the main exhaust air space 254 as exhaust air 262. The airflow through the system is typically driven entirely by the fans of the computing devices 240 as previously described, although in some embodiments one or more dedicated fans or blowing mechanisms may aid in moving the air through the system.

As previously described, it should be appreciated that FIG. 5 is provided for illustrative purposes and that the second air inlet 214, the exhaust outlet 220, and/or the damper 250 may be incrementally or partially opened so that some fraction of a maximum airflow of cool air 260 is delivered through the second air inlet 214 and so that some fraction of a maximum airflow of exhaust air 262 is vented from the facility. The mixing damper 232 may likewise be incrementally or partially closed so that some fraction of a maximum airflow of exhaust air 262 is delivered through the mixing damper 232 to the mixing chamber 216 for mixing with the cool air 260 that flows through the first air inlet 212. Thus, the flow of cool air 260, exhaust air 262, and heated air 264 through the system may include any incremental airflow percentage or volume between the illustrations of FIG. 4 and FIG. 5 as a person of skill in the art will readily understand.

Figure 7:
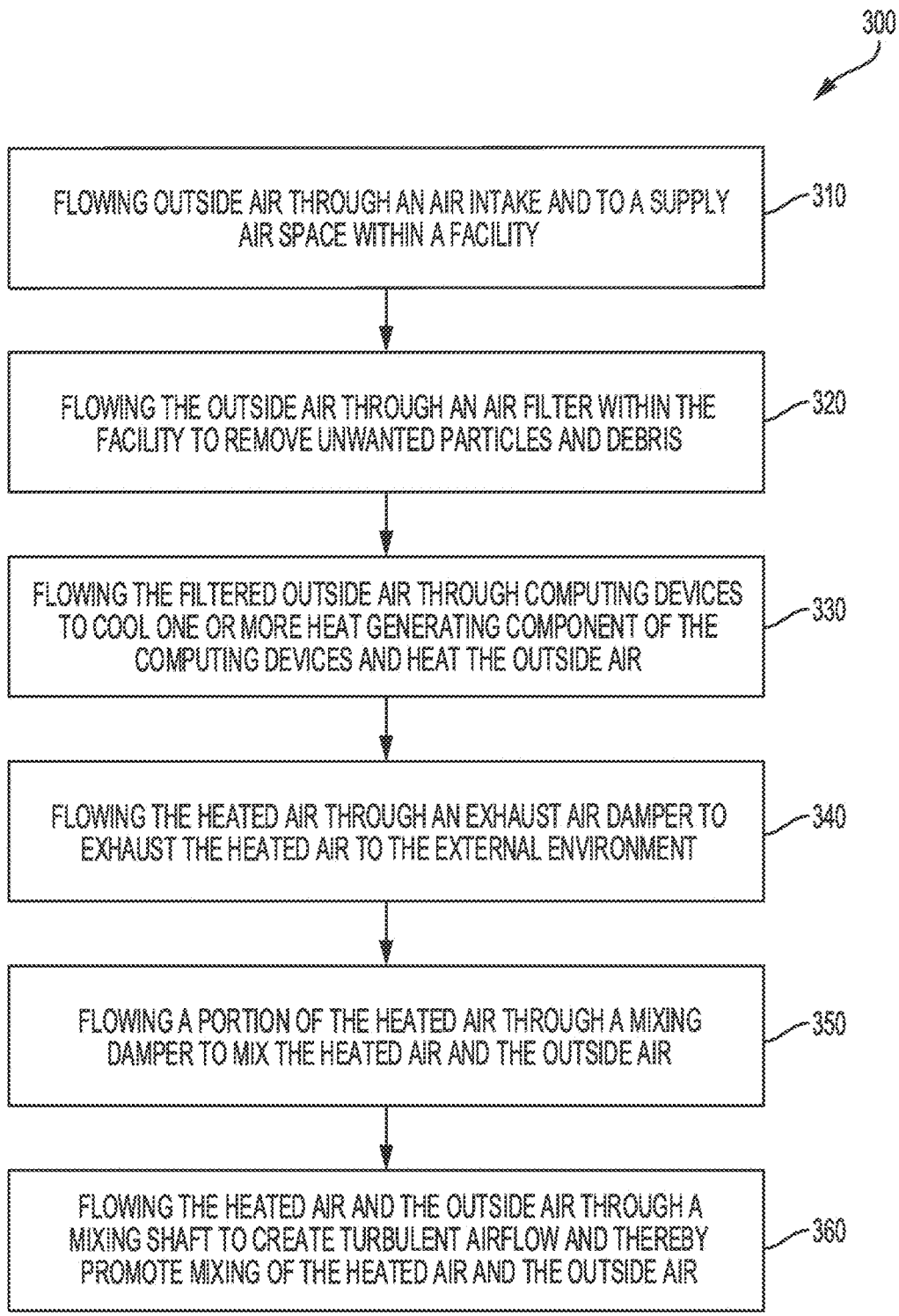
FIG. 7 illustrates a method of cooling computing devices within a facility.

Referring now to FIG. 7, illustrated is a method 300 of cooling computing devices within a facility. As described herein, the facility has an interior space that includes a supply air space and an exhaust air space. At block 310, outside air flows from an external environment, through an air inlet of an exterior wall of the facility, and to the supply air space within the facility. At block 320, the outside air flows through an air filter assembly within the facility to filter the outside air and thereby remove unwanted particles and debris from the outside air. At block 330, the filtered outside air flows through a plurality of computing devices in order to cool one or more heat generating component of the computing devices. The computing devices are arranged within the interior space of the facility so that the computing devices partition at least a portion of the supply air space from the exhaust air space. In some embodiments, most or all of the computing devices include a fan that is capable of moving the filtered outside air across the one or more heat generating components to cool the heat generating components and heat the filtered outside air. The heated air flows into the exhaust air space from the computing devices. At block 340, the heated air flows through an exhaust air damper to exhaust the heated air from the exhaust air space to the external environment. The airflow of the outside air and the heated air is substantially driven by the combined airflow of a plurality of the fans of the computing devices as described herein.

At block 350, at least a portion of the heated air flows through a mixing damper that is positioned within the interior space of the facility between the supply air space and the exhaust air space. The heated air flows through the mixing damper to enable mixing of the heated air and the outside air supplied through the air inlet. As described herein, block 350 is an optional step that may be used to increase the temperature of the outside air and/or reduce the relative humidity of the outside air. The interior space of the facility may include a hot air space, or recirculated air space, that is positioned vertically above the computing devices. The hot air space may be in fluid communication with the exhaust air space so that heated air is flowable from the exhaust air space into the hot air space. The mixing damper may be positioned on an exterior end of the hot air space. In such embodiments, the method 300 may also include closing the exhaust air damper and opening the mixing damper to control an amount of heated air that flows through the mixing damper and mixes with the outside air. The facility may include two air inlets that are each configured to supply outside air to the supply air space from the external environment. A second air inlet may be positioned vertically below a first air inlet. In such embodiments, the method 300 may further include closing a damper of the second air inlet to increase an amount of outside air that flows through the first air inlet and mixes with the heated air that flows through the mixing damper.

At block 360, the outside air and the heated air flow through a mixing shaft or chamber to create turbulent airflow and thereby promote mixing of the outside air and the heated air. Block 360 is an optional step that is conditioned on the occurrence of block 350. The mixing shaft may include a plurality of elongate members that project into the mixing shaft to create the turbulent airflow. The mixed outside air and heated air may flow through an air filter that is coupled with a bottom end of the mixing shaft and with a floor of the facility.

The computing devices may be arranged within the interior space of the facility to form a wall that partitions the supply air space and the exhaust air space. The wall may be two stories tall and/or the facility may include at least two floors of computing devices. As described herein, the facility may include two air inlets that are each configured to supply outside air to the supply air space from the external environment. A second air inlet may be positioned vertically below a first air inlet. In such embodiments, the method 300 may further include flowing outside air through the first air inlet and through the second air inlet into the supply air space. A combined airflow through the first air inlet and through the second air inlet may be approximately equal to the airflow through the exhaust air damper.

While several embodiments and arrangements of various components are described herein, it should be understood that the various components and/or combination of components described in the various embodiments may be modified, rearranged, changed, adjusted, and the like. For example, the arrangement of components in any of the described embodiments may be adjusted or rearranged and/or the various described components may be employed in any of the embodiments in which they are not currently described or employed. As such, it should be realized that the various embodiments are not limited to the specific arrangement and/or component structures described herein.

In addition, it is to be understood that any workable combination of the features and elements disclosed herein is also considered to be disclosed. Additionally, any time a feature is not discussed with regard to an embodiment in this disclosure, a person of skill in the art is hereby put on notice that some embodiments of the invention may implicitly and specifically exclude such features, thereby providing support for negative claim limitations.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the device" includes reference to one or more devices and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A system for cooling computing devices, comprising:
a facility having an interior space that includes a supply air space and an exhaust air space, the supply air space configured to receive outside air from an external environment of the facility, the exhaust air space configured to exhaust heated air to the external environment;
an air inlet coupled to an exterior wall of the facility and configured to deliver outside air to the supply air space from the external environment;
an exhaust air outlet configured to exhaust the heated air from the exhaust air space to the external environment;
a plurality of computing devices arranged within a computing space of the supply air space fluidically connecting the supply air space and the exhaust air space, wherein at least some of the plurality of computing devices include at least one fan of a plurality of computing device fans that, when operable, draw the outside air from the external environment into the supply air space through the air inlet, move the outside air from the supply air space across one or more heat generating components of the plurality of computing devices to cool the one or more heat generating components, exhaust the outside air into the exhaust air space as heated air, and push the heated air within the exhaust air space into the external environment through the exhaust air outlet;
the interior space further including a mixing chamber in which a temperature of the outside air is adjusted via mixing, the mixing chamber disposed downstream of the air inlet and upstream of the plurality of computing devices;
wherein the mixing chamber is at least partially defined between the exterior wall of the facility and an interior wall at least partially separating the mixing chamber and the computing space;
wherein the plurality of computing device fans are configured to provide sufficient airflow of the outside air through the system to cool the plurality of computing devices;
wherein an overall airflow through the system is driven by the plurality of computing device fans and an average temperature of the system is maintained within a desired temperature range by the overall airflow through the system;
wherein the facility is a multi-story facility including a plurality of levels;

wherein the computing space includes a main portion, a first computing floor portion, and a second computing floor portion disposed above the first computing floor portion;

wherein the mixing chamber is in fluid communication with the main portion of the computing space via an air filter: and wherein the main portion of the computing space is in fluid communication with the first computing floor portion and the second computing floor portion via at least one second air filter.

2. The system of claim 1, wherein one or more of the plurality of computing device fans is not operated, or is operated at less than full capacity, when driving the overall airflow through the system.

3. The system of claim 1, wherein the overall airflow through the system is entirely driven by the plurality of computing device fans.

4. The system of claim 1, wherein:
a second air inlet is coupled to the exterior wall of the facility and is configured to deliver the outside air to the supply air space from the external environment;
the second air inlet is disposed in an upper region of the exterior wall adjacent to an area where the heated air in the exhaust air space is flowable into the mixing chamber;
the air inlet is disposed in a lower region of the exterior wall below the second air inlet and includes a damper configured to control an amount of outside air that flows through the air inlet to the supply air space; and
the air inlet and the second air inlet each supply outside air from the external environment directly into the mixing chamber.

5. The system of claim 1, further comprising an exhaust air vent coupled to a ceiling of the facility, through which the heated air is flowable from the exhaust air space to the external environment, wherein the exhaust air outlet is coupled to an exterior vertical wall of the facility.

6. The system of claim 1, further comprising a plurality of elongate members disposed within the mixing chamber to create turbulent airflow.

7. The system of claim 1, wherein at least one of (i) the air filter, and (ii) the at least one second air filter, is structured as a low pressure drop air filter configured to filter particulate from the outside air supplied to the plurality of computing devices and further configured to provide a pressure differential between the air inlet and the plurality of computing devices.

8. The system of claim 1, wherein:
the air filter is structured as a vertical wall extending between a lower region of the interior wall and a floor of the facility; and
the air filter is at least one of an accordion air filter and a pleated air filter.

9. The system of claim 8, wherein the air filter is disposed adjacent to and aligned with the air inlet such that outside air is flowable directly from the air inlet to the air filter.

10. The system of claim 1, wherein the supply air space and the exhaust air space are partitioned in a relatively air tight manner such that i) the outside air is flowable from the supply air space to the exhaust air space via the plurality of computing devices and ii) a backflow of the heated air from the exhaust air space to the supply air space is substantially prevented.

11. The system of claim 1, wherein the plurality of computing device fans are configured to drive the overall airflow through the system at an air speed of approximately 300 to 600 feet per minute.

12. The system of claim 1, further comprising a plurality of elongate members disposed within the mixing chamber to create turbulent airflow, wherein the mixing chamber is compartmentalized such that in a section of the mixing chamber the plurality of elongate members do not impede air flow.

13. The system of claim 1, further comprising
a screen arranged upstream of the air filter, the screen configured to prevent at least one of animals and debris from entering the supply air space through the air inlet.

14. A method of cooling computing devices within a multi-story facility including a plurality of levels and having an interior space that includes a supply air space and an exhaust air space, the method comprising:
producing an overall airflow through the facility via a plurality of computing device fans of a plurality of computing devices disposed in a computing space of the supply aft space, the plurality of computing device fans configured to provide sufficient airflow of outside air through the facility to cool the plurality of computing devices, the computing space including a main portion, a first computing floor portion, and a second computing floor portion disposed above the first computing floor portion;
maintaining an average temperature of the facility within a desired temperature range via the overall airflow through the facility; and
wherein producing the overall airflow through the facility includes:
flowing outside air from an external environment of the facility through an au inlet of an exterior wall of the facility to supply the outside air to the supply air space;
flowing the outside air through a mixing chamber of the interior space to adjust a temperature of the outside air, the mixing chamber at least partially defined between the exterior wall of the facility and a vertical interior wall at least partially separating the mixing chamber and the computing space, the mixing chamber in fluid communication with the main portion of the computing space via an air filter, the main portion of the computing space in fluid communication with the first computing floor portion and the second computing floor portion via at least one second air filter;
flowing the outside air through the plurality of computing devices and across one or more heat generating components of the plurality of computing devices to remove heat from the one or more heat generating components;
flowing the outside air into the exhaust air space from the plurality of computing devices as heated air; and
flowing the heated air through an exhaust air outlet to exhaust the heated air in the exhaust air space from the facility to the external environment.

15. The method of claim 14, wherein producing the overall airflow through the facility further includes flowing temperature-adjusted outside air from the mixing chamber to the plurality of computing devices.

16. The method of claim 14, further comprising, prior to flowing the outside through the plurality of computing devices, filtering the outside air and removing unwanted particles and debris from the outside air via flowing the outside air through at least one of (i) the air filter and (ii) the at least one second air filter.

17. The method of claim 16, further comprising providing a pressure differential between the air inlet and the plurality of computing devices via configuring a cross sectional area of the air filter.

18. The method of claim 14, further comprising turbulating airflow through the mixing chamber with a plurality of elongate members that project into the mixing chamber.

\* \* \* \* \*